(12) United States Patent
Asenath-Smith et al.

(10) Patent No.: US 11,421,340 B2
(45) Date of Patent: Aug. 23, 2022

(54) VERTICAL DRAW SYSTEM AND METHOD FOR SURFACE ADHESION OF CRYSTALLINE MATERIALS

(71) Applicant: United States of America as Represented by The Secretary of The Army, Alexandria, VA (US)

(72) Inventors: Emily Asenath-Smith, Norwich, VT (US); Garrett R. Hoch, Lebanon, NH (US); Christopher J Donnelly, Piermont, NH (US); Jordan M. Hodge, Bradford, VT (US)

(73) Assignee: UNITED STATES OF AMERICA AS REPRESENTED BY THE SECRETARY OF THE ARMY, Alexandria, VA (US)

( * ) Notice: Subject to any disclaimer, the term of this patent is extended or adjusted under 35 U.S.C. 154(b) by 0 days.

(21) Appl. No.: 16/802,490

(22) Filed: Feb. 26, 2020

(65) Prior Publication Data
US 2021/0262118 A1  Aug. 26, 2021

(51) Int. Cl.
*C30B 28/10* (2006.01)
*C30B 29/68* (2006.01)

(52) U.S. Cl.
CPC .............. *C30B 28/10* (2013.01); *C30B 29/68* (2013.01)

(58) Field of Classification Search
CPC ......... C30B 28/10; C30B 29/68; C30B 15/14; C30B 15/20
See application file for complete search history.

(56) References Cited

U.S. PATENT DOCUMENTS

| | | | | |
|---|---|---|---|---|
| 4,226,834 A | * | 10/1980 | Shudo | C30B 15/06 117/212 |
| 5,555,747 A | * | 9/1996 | Conlon | C02F 1/22 62/532 |
| 6,090,198 A | * | 7/2000 | Aydelott | C30B 15/36 117/13 |
| 2013/0112135 A1 | * | 5/2013 | Carlson | C30B 29/06 117/73 |

OTHER PUBLICATIONS

Libbrecht et al. "Measurements of surface attachment kinetics for faceted ice crystal growth" Journal of Crystal Growth vol. 377, 2013 pp. 1-8.*

* cited by examiner

*Primary Examiner* — Robert M Kunemund
(74) *Attorney, Agent, or Firm* — Brian C. Jones

(57) ABSTRACT

In one embodiment employing a vertical draw apparatus, a method of crystallization growth on a substrate surface of a substrate having a substrate material includes: mounting the substrate to a sample holder with the substrate surface facing a liquid surface of a reservoir disposed in a chamber that provides an ambient temperature; seeding the substrate surface with seed droplets; lowering the substrate surface to the liquid surface of the reservoir; independently controlling a temperature of the substrate and a temperature of the reservoir to produce a temperature difference between the substrate and the reservoir over a period of time for crystallization growth; and retracting the substrate surface from the liquid surface of the reservoir at a draw rate. The draw rate and the temperature difference are selected to grow polycrystalline laminate on the substrate surface. Consistent polycrystalline columnar microstructures are formed with appropriate seeding of the substrate surface.

18 Claims, 5 Drawing Sheets

Table 1. Properties of materials used as substrates for ice crystallization

| Material | Thickness | Roughness ($R_a$) | Contact angle ($\theta_{adv}/\theta_{rec}$, degrees) | Thermal Conductivity (W/mK)[d] | Specific Heat (kJ/kg °C)[d] |
|---|---|---|---|---|---|
| Aluminum[a] | 10 mm | 0.29±0.01 μm | 71±2/44±3 | 165 | 0.87 |
| Glass | 1 mm[b] | 0.46±0.03 nm | 28±2/17±2 | 0.96 | 0.84 |
| Teflon | 25 μm[c] | 1.29±0.27 μm | 114±2/96±2 | 0.25 | 1.2 |

[a]Polished to P4000
[b]Adhered to aluminum coupon with thermally conductive grease
[c]Coated over 10 mm aluminum coupon
[d]Values from The Engineering ToolBox (www.engineeringtoolbox.com)

Fig. 2

VERTICAL DRAW SYSTEM AND METHOD FOR SURFACE ADHESION OF CRYSTALLINE MATERIALS

STATEMENT OF GOVERNMENT INTEREST

Under paragraph 1(a) of Executive Order 10096, the conditions under which this invention was made entitle the Government of the United States, as represented by the Secretary of the Army, to an undivided interest therein on any patent granted thereon by the United States. This and related patents are available for licensing to qualified licensees.

BACKGROUND

Field of the Invention

The present invention relates to growing polycrystalline materials on surfaces by vertical draw, and, more particularly but not exclusively, to surface adhesion of polycrystalline ice by a crystallization-from-the-melt technique.

Description of the Related Art

This section introduces aspects that may help facilitate a better understanding of the invention. Accordingly, the statements of this section are to be read in this light and are not to be understood as admissions about what is prior art or what is not prior art.

The growth of ice on surfaces is ubiquitous in natural environments. While the beauty of its various forms, from glaze to rime, inspire awe and wonder, the reality of ice adhesion can be catastrophic. Ice adhesion threatens the safety and success of systems around the globe: halting transportation, interrupting power, severing communications, and grounding aerial vehicles. Research studies continue to produce promising passive methods to resist ice adhesion and enhance ice removal from surfaces, but the transfer of these technologies to engineering systems continues to lag behind outcomes of small scale testing. In part, this gap stems from the absence of any standard methods for testing ice adhesion; moreover, there is limited guidance available about growth of ice on surfaces for adhesion studies. Being that the adhesion of ice to surfaces is known to vary with ice type, robust and well document ice growth methods are needed to support the development of standards for ice adhesion testing and analysis.

The growth of large single crystals of ice has been accomplished via many methods from zone refining to melt solidification and various molded methods. A small group of reports have derived inspiration from Czochralski's method, drawing a solid single crystal (of ice) from a liquid melt (of water). See, e.g., A. Higashi, Growth and Perfection of Ice Crystals, Journal of Crystal Growth, 24 (1974) 102-107. While the Czochralski technique has been used to introduce impurities into ice, the goal has largely been to form high purity, large single crystals of ice for optical (see, e.g., C. A. Knight, A Simple Technique for Growing Large, Optically "Perfect" Ice Crystals, Journal of Glaciology, 42 (1996) 585-587) and fundamental surface chemistry investigations (see, e.g., P. Bisson et al., High Yield, Single Crystal Ice via the Bridgman Method, Review of Scientific Instruments, 87 (2016) 034103).

Polycrystalline ice is the form most commonly found in nature, regardless of whether it is formed from the accretion of small supercooled droplets or the slow freezing of large volumes of water. Growth of polycrystalline ice on surfaces by static means often employs molds to contain the liquid water, but ice formation on surfaces has also been accomplished by application of freezing drizzle (see, e.g., C. Laforte et al., Deicing Strains and Stresses of Iced Substrates, Journal of Adhesion Science and Technology, 26 (2012) 603-620) and the dynamic impact of super cooled droplets (see, e.g., S. Tarquini et al., Investigation of Ice Shedding Properties of Superhydrophobic Coatings on Helicopter Blades, Cold Regions Science and Technology, 100 (2014) 50-58). Most static methods utilize a range of reported curing times to equilibrate temperature (see, e.g., M. Landy et al., Adhesion of Ice to Plastics, Journal of Colloid and Interface Science, 25 (1967) 231-244), and relieve stresses in the ice caused by the confinement of molds (see, e.g., R. Haehnel et sl., The Bond Strength of Ice-Solid Interface Loaded in Shear, Ice in Surface Waters, Shen, Rotterdam. (1998) 597-604). Few details are reported on the thermal gradients and nucleation, which influence the ice microstructure and the mechanical response of ice during adhesion experiments. Moreover, there is not yet a method to selectively freeze single crystal versus polycrystalline ice on surfaces with specific control over the microstructures.

SUMMARY

The present invention was developed to address the need for a robust crystallization method for growth of freshwater ice on surfaces. Research and development has led to a novel vertical draw method and apparatus to crystallize ice directly onto surfaces from a liquid water melt. The research shows that surface crystallization is induced by optimizing the temperature difference between the substrate and liquid water reservoir, and that seeding the substrates is used to obtain consistent polycrystalline columnar microstructures. These results are presented in the context of the thermal, chemical, and physical properties of the substrate surfaces, so as to provide a crystallization approach that is broadly applicable to ice adhesion investigations on a wide range of surfaces. Embodiments of the present invention encompass the use of vertical draw systems and methods for growing ice on surfaces to achieve consistent polycrystalline columnar microstructures.

The present invention advances the science of crystallization, including ice crystallization. A new crystallization tower, based on the vertical draw, crystallization-from-the-melt technique of Czochralski, was designed, constructed, and validated for the growth of columnar ice on a range of material surfaces. In one current configuration, for example, the crystallization tower can be used to grow crystalline laminates of ice, which are up to 75 mm thick, on rectangular substrates that are up to 90 mm in diameter. Key to the success of this apparatus is the ability to independently control the temperatures of the substrate and the liquid reservoir to achieve a desired temperature difference between the substrate and liquid reservoir as well as the speed of the linear stage used to regulate vertical motion. By imposing slow draw rate of the substrate surface from the liquid surface of the reservoir, with small undercooling of the substrate, the ice laminates formed on the various surfaces showed close correspondence to the underlying rectangular shape of the substrates. With pre-seeding of the substrates, well-ordered polycrystalline ice with columnar microstructures was grown on aluminum and glass surfaces. Due to the rough, hydrophobic nature of Teflon, the microstructures were less ordered but still columnar. As a result of the low thermal conductivity of glass, larger undercooling was required to achieve growth on these surfaces as compared to aluminum. The crystallization tower can be used to grow ice directly on a variety of surfaces in a highly robust and automated fashion, which is of great utility to ice adhesion studies and investigations into the fundamental properties of ice.

The present invention differs from the traditional Czochralski method, which has been widely applied to obtain single crystals of semiconductors that require crystallization temperature over +1000° C. due to their high melting points. In contrast, the present system and method can be used to obtain polycrystalline laminates by crystallizing any materials that crystallize at temperatures well under +1000° C., for instance, under about +100° C. and, more specifically, over the temperature range of about −30° C. to about +70° C., which is the temperature range of the coolant supplied to the sample holder for the substrate and to the reservoir using a tubing made of a polymeric material for crystallizing water and other low melting point compounds such as paraffin, oleic acid, dimethylsulfoxide, polycyclic aromatic hydrocarbons, or the like, according to specific embodiments of the invention.

Embodiments of the present invention encompass systems and methods for growing polycrystalline materials on surfaces by vertical draw. According to one aspect, a method of crystallization growth on a substrate surface of a substrate having a substrate material comprises mounting the substrate to a sample holder with the substrate surface facing a liquid surface of a reservoir disposed in a chamber that provides an ambient temperature; seeding the substrate surface with seed droplets; lowering the substrate surface to the liquid surface of the reservoir; independently controlling a temperature of the substrate and a temperature of the reservoir to produce a temperature difference between the substrate and the reservoir over a period of time for crystallization growth; and retracting the substrate surface from the liquid surface of the reservoir at a draw rate; wherein the draw rate and the temperature difference are selected to grow polycrystalline laminate at a crystallization temperature of under about +100° C. on the substrate surface.

In some embodiments, the temperature of the reservoir is controlled to achieve a stable liquid surface temperature. The temperature of the substrate may be controlled by undercooling the sample holder to an initial temperature that is lower than the liquid surface temperature for an initial period of time; ramping the temperature of the substrate from the initial temperature to a final temperature that is lower than the initial temperature for a ramp period of time, and holding the temperature of the substrate at the final temperature for a final period of time. The temperature of the substrate may be linearly ramped from the initial temperature to the final temperature.

In specific embodiments, the polycrystalline laminate is polycrystalline ice laminate and wherein the draw rate is a fixed rate selected to closely match a velocity of a freezing front of ice growth on the substrate surface. Seeding the substrate surface comprises spraying the substrate surface with ultrapure water.

In some embodiment, the method further comprises; prior to seeding the substrate surface, allowing thermal equilibration of the substrate and the sample holder for an equilibration period of time. The method may further comprise maintaining the ambient temperature in the chamber at a level that is lower than the temperature of the substrate.

In specific embodiments, the method is performed according to stored information that includes at least one of the substrate material, the seed droplets, the ambient temperature, the temperature of the substrate, the temperature of the reservoir (including the stir rate of a stir plate if it is used to control the temperature of the reservoir), the temperature difference between the substrate and the reservoir over the period of time for crystallization growth, or the draw rate, the stored information having previously been used to grow polycrystalline ice with columnar microstructures on the substrate surface.

According to another aspect of the present invention, a system of crystallization growth on a substrate surface of a substrate having a substrate material comprises a frame disposed in a chamber that provides an ambient temperature; a container having a reservoir therein; a sample holder to mount the substrate above the reservoir with the substrate surface facing a liquid surface of the reservoir; a sample holder temperature control device to control a temperature of the sample holder; a reservoir temperature control device to control a temperature of the reservoir independently of the temperature of the sample holder to produce a temperature difference between the substrate and the reservoir over a period of time for crystallization growth; and a linear stage to lower the substrate surface to the liquid surface of the reservoir and to retract the substrate surface from the liquid surface of the reservoir at a draw rate; wherein the draw rate and the temperature difference are selected to grow polycrystalline laminate at a crystallization temperature of under about +100° C. on the substrate surface.

In some embodiments, the system further comprises a computer programmed to: after the substrate surface is seeded with seed droplets, lower the substrate surface to the liquid surface of the reservoir; independently control the temperature of the substrate and the temperature of the reservoir to produce a temperature difference between the substrate and the reservoir; and retract the substrate surface from the liquid surface of the reservoir at a draw rate selected to grow polycrystalline ice laminate on the substrate surface.

In specific embodiments, the temperature of the reservoir is controlled to achieve a stable liquid surface temperature. The temperature of the substrate may be controlled by undercooling the sample holder to an initial temperature that is lower than the liquid surface temperature for an initial period of time, ramping the temperature of the substrate from the initial temperature to a final temperature that is lower than the initial temperature for a ramp period of time, and holding the temperature of the substrate at the final temperature for a final period of time. The temperature of the substrate may be linearly ramped from the initial temperature to the final temperature. The draw rate may be a fixed rate selected to closely match a velocity of a freezing front of ice growth on the substrate surface to ensure control over the radial dimensions of the laminates grown on surfaces.

In some embodiments, the computer is programmed to, prior to seeding the substrate surface, allow thermal equilibration of the substrate and the sample holder for an equilibration period of time. The computer may be programmed to maintain the ambient temperature in the chamber at a level that is lower than the temperature of the substrate.

In specific embodiments, the computer is programmed to employ stored information that includes at least one of the substrate material, the seed droplets, the ambient temperature, the temperature of the substrate, the temperature of the reservoir, the temperature difference between the substrate and the reservoir over the period of time for crystallization growth, or the draw rate, the stored information having previously been used to grow polycrystalline ice with columnar microstructures on the substrate surface.

Yet another aspect of the invention is directed to a computer program product for crystallization growth on a substrate surface of a substrate having a substrate material, which is mounted to a sample holder with the substrate surface facing a liquid surface of a reservoir disposed in a chamber that provides ambient temperature. The computer program product is embodied on a non-transitory tangible computer readable medium, and comprises: computer-executable code for, after the substrate surface is seeded with seed droplets, lowering the substrate surface to the liquid surface of the reservoir; computer-executable code for independently controlling the temperature of the substrate and the temperature of the reservoir to produce a temperature difference between the substrate and the reservoir over a period of time for crystallization growth; and computer-executable code for retracting the substrate surface from the liquid surface of the reservoir at a draw rate; wherein the draw rate and the temperature difference are selected to grow polycrystalline laminate at a crystallization temperature of under about +100° C. on the substrate surface.

In specific embodiments, the computer program product further comprises computer-executable code for employing stored information that includes at least one of the substrate material, the seed droplets, the ambient temperature, the temperature of the substrate, the temperature of the reservoir, the temperature difference between the substrate and the reservoir over the period of time for crystallization growth, or the draw rate, the stored information having previously been used to grow polycrystalline ice laminate with columnar microstructures on the substrate surface.

Hence, embodiments of the present invention encompass techniques for growing polycrystalline materials on surfaces by vertical draw, including the formation of polycrystalline laminates by surface adhesion of polycrystalline materials such as polycrystalline ice laminates by the crystallization-from-the-melt technique. Advantageously, embodiments of the present invention can be used to effectively grow polycrystalline laminates, such as polycrystalline ice laminates of water and laminates of other low melting point compounds such as paraffin, oleic acid, dimethylsulfoxide, polycyclic aromatic hydrocarbons (see Mitchell, Haydn T., Merry K. Smith, Nicholas D. Blelloch, Douglas W. Van Citters, and Katherine A. Mirica. "Polycyclic aromatic hydrocarbons as sublimable adhesives." Chemistry of Materials 29, no. 7 (2017): 2788-2793), and the like, directly on a variety of surfaces in a highly robust and automated fashion, which is of great utility to ice adhesion studies and investigations into the fundamental properties of ice.

BRIEF DESCRIPTION OF THE DRAWINGS

Embodiments of the invention will become more fully apparent from the following detailed description, the appended claims, and the accompanying drawings in which like reference numerals identify similar or identical elements.

FIG. 1A shows the vertical draw tower including a sample holder to which the substrate is attached. FIG. 1B is a view of the sample holder showing a refrigerated circulating path for temperature control of the substrate via the sample holder.

FIG. 2 shows a table of the properties of materials used as substrates for the ice crystallization experiments.

FIG. 3A shows temperature profiles of the various components of the ice growth system during crystallization of ice on aluminum. FIG. 3B shows the temperature profile (designated with arrow in the IR image inset) along the substrate-ice-water line at 60 minutes into an ice growth.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In at least one embodiment, the present invention aims to address the shortcoming of currently known techniques for growing polycrystalline ice by providing novel vertical draw method and apparatus to crystallize ice directly onto surfaces from a liquid water melt. The research shows that surface crystallization is induced by optimizing the temperature difference between the substrate and liquid water reservoir, and that seeding the substrates is used to obtain consistent polycrystalline columnar microstructures.

Embodiments of the present invention encompass the use of vertical draw systems and methods for growing polycrystalline laminates such as polycrystalline ice laminates on surfaces to achieve consistent polycrystalline columnar microstructures. For example, such techniques were used to grow freshwater ice on surfaces of different materials by crystallizing ice directly onto the surfaces from a liquid water melt. Seeding of the substrate and control of temperatures, temperature differences, and draw rate led to a crystallization approach that is broadly applicable to ice adhesion investigations on a wide range of surfaces.

Figure 1A:
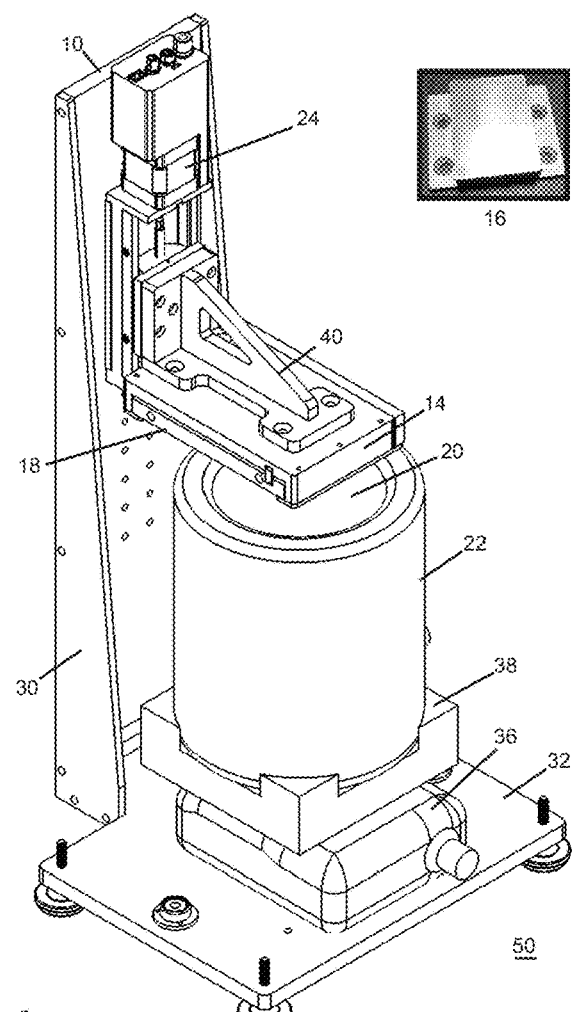
FIGS. 1A and 1B illustrate a crystallization apparatus used for growth of polycrystalline laminate such as polycrystalline ice laminate on a substrate surface employing a vertical draw method according to an embodiment of the present invention.
Figure 1B:
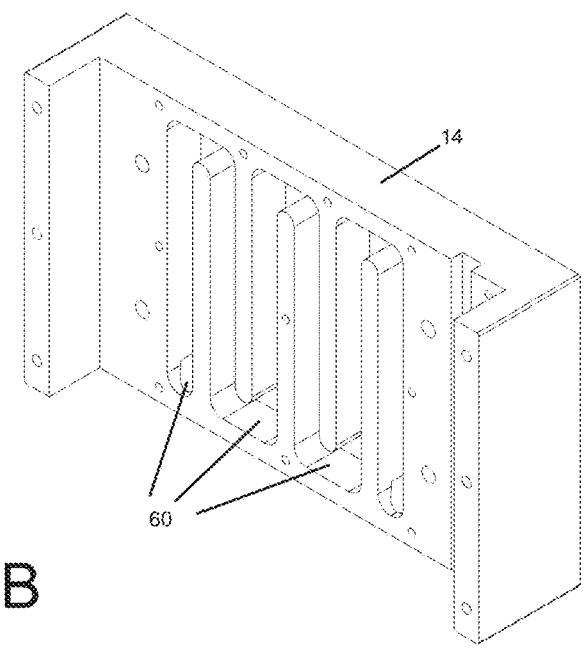

FIGS. 1A and 1B illustrate a crystallization apparatus 10 used for growth of polycrystalline laminate such as polycrystalline ice laminate on a substrate surface employing a vertical draw method. FIG. 1A shows the vertical draw tower 10 including a sample holder 14 to which the substrate 16 is attached. The crystallization tower 10 is designed to facilitate reproducible growth of freshwater columnar ice on surfaces for the purposes of ice adhesion studies. The design employs the vertical draw method of Czochralski, wherein a precisely tuned temperature gradient is used to pull crystals from the melt. See, e.g., J. Friedrich, Methods for Bulk Growth of Inorganic Crystals: Crystal Growth (2016). In the case of ice, the components of the apparatus had to operate at freezing temperatures with independent temperature control over the liquid reservoir and solid substrate. To crystallize ice directly on the substrate surface, a temperature controlled sample holder 14 is provided to accommodate a substrate 16, which can be composed of a variety of materials and advanced material coatings.

The substrate 16 (inset) has the top surface upon which ice growth occurs and is mounted to a back plate 18 of the sample holder 14 in an inverted position to face the reservoir so that the top surface of the substrate 16 can be lowered to the liquid surface of a reservoir 20 provided in a container 22 by motion of a linear stage 24. The sample holder 14 and reservoir 20 are provided with independent temperature control to impose a thermal gradient that drives the crystallization from the melt process.

In one specific embodiment, the body or frame 30 of the crystallization tower (FIG. 1A) is composed of an aluminum frame, which is 64 cm tall with a 22.5×30 cm base 32. A stirred double-walled beaker 22 serves as the container for the liquid reservoir 20 and sits atop a stir plate 36. The stir plate 36 is anchored by an inset area in the base 32 of the frame 30 and a machined collar 38 is used to position the reservoir beaker 22 on the stir plate 36. Vertical drawing of the substrate 16 from the water surface of the reservoir 20 is achieved by motion of an arm 40 with the automated linear stage 24. Multiple screw holes on the backside of the tower body 30 allow the location of the linear stage 24 to be adjusted to different heights to accommodate different reservoir sizes. The entire assembly is positioned in a cold environmental chamber 50. The temperature of the cold chamber 50 is set at −14° C. in one specific embodiment.

FIG. 1B is a view of the sample holder 14 showing a refrigerated circulating path 60 for temperature control of the substrate 16 via the sample holder 14. The refrigerated circulating path 60 is typically a labyrinth of channels inside through which the temperature controlled circulating coolant fluid (e.g., ethylene glycol) is flowed. The back plate 18 fits into the sample holder slot, keeps the cooling fluid within the circulating path, and transfers cooling from the cooling fluid to the substrate 16. Temperature control of the circulating fluid is achieved, for example, with an immersion circulator. The immersion circulator preferably has a programmable capability, which can be used to program a linear or nonlinear ramp from an initial temperature to a final temperature that is below the initial temperature, or to maintain a constant temperature setpoint.

Two separate immersion circulators are used to control the temperature of the reservoir 20 and the temperature of the substrate 16, respectively. During ice growth in a specific embodiment, the circulator that controls the reservoir temperature is set to 1.75° C. This temperature achieves a stable water surface temperature of 0.4±1° C. during ice growth when subject to the ambient temperature of the room (−14° C.). The circulator that controls the substrate temperature does so by circulating fluid through the refrigerated circulating path 60 of the sample holder 14. To ensure thermal equilibration of the substrate 16 with the sample holder 14, the assembly is allowed to equilibrate for about 30 minutes before crystallization is initiated. Water in the reservoir 20 is stirred at a rate of 60 rpm of the stir plate 36. Ice growth occurs directly on the inverted substrate 16 which is screw mounted onto an aluminum back plate 18. The automated linear stage 24 is used to bring the substrate 16 in contact with the water surface of the reservoir 20 and then withdraw the coupon at a fixed rate of about 0.9 µm/s for the duration of the ice growth in a specific embodiment. More specifically, the substrate 16 is lowered to the point where the substrate surface makes capillary contact with the liquid surface at the start of crystallization. As used herein, contact for crystallization means that the typically planar surface of the substrate is in capillary contact with the liquid surface of the reservoir. As the growth proceeds and the substrate 16 is raised, the substrate 16 moves away from the water surface, but the ice crystallization front remains in contact with the liquid surface of the reservoir due to the growth and thickening of the ice laminate on the substrate. Upon completion, the stage 24 then raises the substrate 16 fully away from the liquid surface.

The crystallization tower 10 was used to perform experiments for growth of ice on material surfaces employing crystallization from the melt technique. Specifics on the crystallization tower apparatus 10 are first presented, followed by its use for ice growth on different material surfaces. The characterization of substrate materials is addressed as well as the resulting ice microstructures and the implications of substrate properties on ice growth.

Experiments were carried out using the following materials: ultrapure de-ionized water (18.2 MΩ, Milli-Q, MilliporeSigma), coolant fluid composed of 50/50 water/ethylene glycol (Dynalene® EG, Dynalene, USA), acetyl resin (Delrin®, DuPont, USA), aluminum substrates (6061 alloy, McMaster-Carr), Teflon (PFA, Chemours) applied via powder coating to a thickness of 25 µm (American Durafilm, USA), glass microscope slides (Corning, USA), and thermally conductive grease for mounting glass substrates (DeoxIT® Grease L260 copper particles).

All experiments were conducted in a digitally controlled environmental chamber 50 (Cincinnati Subzero, USA) at −14±1° C. Coolant was supplied to components with a refrigerated circulating bath (PC 200 Immersion Circulator, Thermo Scientific, USA) with 0,015° C. accuracy and a flow rate of 24 L/min. Deposition of starter seed crystals on the surface of substrates 16 was accomplished with a high volume low pressure (HVLP) spray gun (Model COM-G513G-18-05, DeVILBISS®, Carlisle Fluid Technologies, USA) with a compact fluid tip (SP-2005-085-K) operating at 30 PSI. A double-walled, jacketed glass beaker 22 (600 mL, Wilmad LabGlass, USA) was used as the liquid water reservoir wherein the temperature could be controlled by flowing coolant through the walls. A linear stage 24 was used to precisely raise and lower the substrate 16 to the water surface (Model X-LSQ075A-E01, Zaber Technologies, Canada). The stage 24 has a maximum continuous thrust of 100 N, a minimum speed of 0.061 µm/s, and a microstep size of 0.099 µm. A magnetic stir plate 36 (Corning, USA) was used to stir the reservoir water. Thin sections of ice crystals were formed with a sliding microtome (SM2400, Leica) in the cold chamber 50 at −15° C., Optical microscopy was performed under cross polarized light (SZH-10, Olympus, USA) and images were acquired with a digital microscope camera (Infinity 3-6URC, Lumenera, Canada). Dynamic contact angle was measured with a contact angle goniometer (Model 590, Rame-Hart, USA) equipped with an automatic tilting stage. The roughness of aluminum and Teflon substrates 16 was measured with a non-contact profilometer (PB1000, Nanovea, USA). The roughness of glass was measured with an atomic force microscope (Dimension Icon, Bruker, USA) operating in tapping mode. Thermal imaging was captured with an IR camera (Model E95, Flir, USA) and processed with ThermaCAM Researcher Pro. Temperature monitoring was performed with thermocouples (Type K) and a data acquisition system (Model cDAQ-9139, National Instruments, USA) at a sampling rate of 1 Hz.

The crystallization tower 10, employing digitally controlled temperature and a fully automated linear stage 24 for vertical motion, is a highly versatile and robust method for crystallizing ice on substrates. In addition to variable growth times and draw rates, the thermal difference across the substrate 16 and reservoir 20 can be tuned from exceedingly small to very large over a wide range of temperatures, only limited by the versatility of the circulator(s). This system can be used to access a variety of ice microstructures from nearly monocrystalline to random polycrystalline and co-oriented columnar microstructures. Most commonly, the system has been used to grow 1 cm thick ice laminates on 30×40 mm substrates in 2.5 h, but it has also been used to grow up to 4 cm thick ice laminates in 7 h, and on substrate areas up to 40×60 mm. The limitation on ice thickness is determined by the maximum travel of the linear stage 24 (75 mm in one configuration); the limitation on substrate area is set by the inner diameter of the reservoir (90 mm in one configuration). Reservoirs 20 with volumes up to 2000 mL have been used, which have an inner diameter of up to about 130 mm and can accommodate substrates up to 120 mm wide.

A broad range of materials can be used as substrates 16 in the crystallization tower 10. The only requirement is that the substrate be mountable to the 100×150 mm back plate 18, so machinable metals are easy candidates. In addition, machinable plastics (e.g., acetal resin or polycarbonate), or coated metals can be used. Typically, the experiments used aluminum substrates that were fabricated with a 30×40 mm raised plateau and were polished before use. These aluminum substrates are commonly used for the application of advanced material coatings.

To study the effect of material properties of the substrate on ice growth using the crystallization tower 10, aluminum, Teflon, and glass were selected since these materials represent a diversity of material properties. FIG. 2 shows a table of the properties of materials used as substrates for the ice crystallization experiments. For example, while glass is very smooth (Ra=0.46±0.03 nm), polished aluminum substrates have intermediate roughness (Ra=0.29±0.01 μm) and Teflon is the roughest (Ra=1.29±0.27 μm). In addition, the materials have a range of wettabilities (contact angle) and thermal conductivities. The current ice growth studies utilized 30×40 mm polished aluminum substrates, a Teflon coating, which was commercially applied over the top surfaces of aluminum substrates, and 30×40 mm glass slides adhered to aluminum substrates with thermally conductive grease.

In preparation for ice growth, the substrate surfaces are cleaned with ultrapure water, allowed to dry, and then set to thermally equilibrate in the sample holder 14 of the ice tower 10 for 30 min. To direct nucleation of polycrystalline ice on the material surfaces, substrates 16 were seeded by spraying the pre-chilled surfaces with ultrapure water. Regardless of the surface wettability of the three materials used in the present study, the seed droplet sizes were statistically similar on each substrate: 14±6 μm on aluminum, 27±11 μm on Teflon, and 29±10 μm on glass. Consistent with delayed droplet freezing on hydrophobic and super-hydrophobic surfaces, seed droplets on Teflon required an additional 10 min to freeze before ice growth was induced on the surfaces.

The process of ice growth on surfaces begins with a 30 min thermal equilibration period, wherein the substrate 16 and back plate 18 are allowed to set in the sample holder 14 at an initial temperature ($T_i$), which depends on the material properties of the target substrate 16. For ice growth on aluminum and Teflon-coated aluminum, $T_i$ was set to −2° C. For growth on glass, $T_i$ was −4° C. After thermal equilibration, the substrates 16 were sprayed with seed droplets and returned to the crystallization tower 10. The substrates 16 were then lowered to the reservoir surface to begin the ice growth process and the substrate holder retraction is engaged.

Ice growth on the substrates 16 was conducted with a temperature ramp from $T_i$ to a final temperature ($T_f$) imposed on the substrate 16 while the reservoir 20 was held at a constant temperature (0.4±−1° C. at the surface). For the growth of polycrystalline columnar ice, the substrate was held at $T_i$ for 30 min, then linearly ramped to $T_f$ over the course of 1.5 h, followed by a hold at $T_f$ for 30 min. For aluminum and Teflon-coated aluminum, $T_i$=−2° C. and $T_f$=−6° C. The glass substrates required $T_i$=−4° C. and $T_f$=−8° C. as a result of the low thermal conductivity of glass and the use of thermal grease to adhere to the aluminum substrate (see FIG. 2). It is noted that the linear temperature ramp is used to achieve stable removal of latent heat to keep crystallization growth rate matched to the draw rate (i.e., to achieve stable heat flux away from the growing ice front); other materials may require other types of ramping including nonlinear ramping, or isothermal substrate temperature.

Figure 3A:
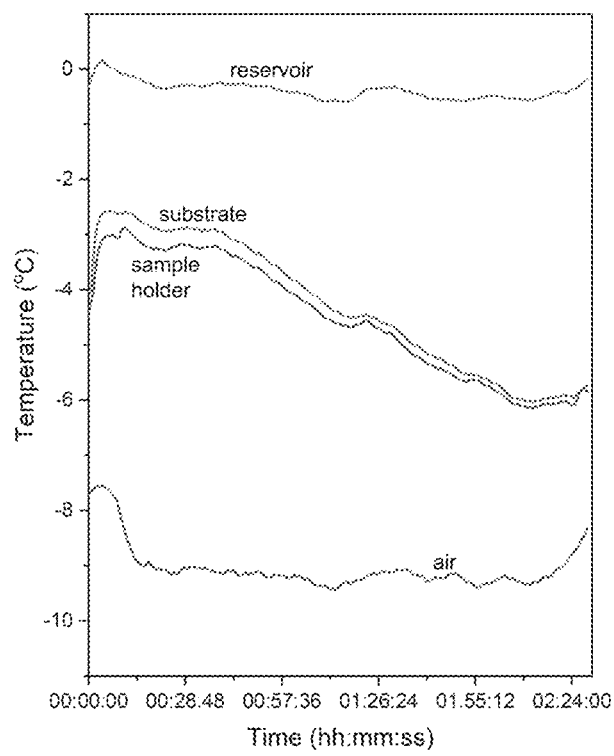
FIGS. 3A and 3B illustrate thermal conditions during crystallization of ice on aluminum substrates.
Figure 3B:
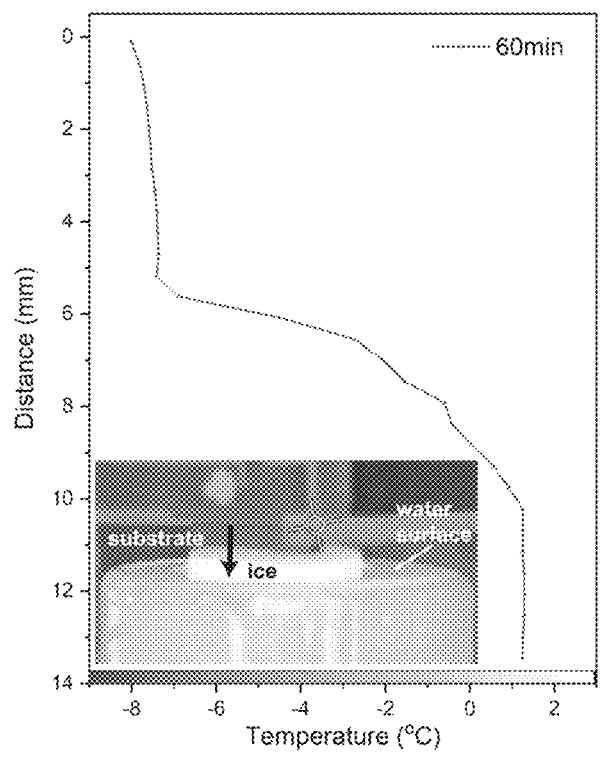

FIGS. 3A and 3B illustrate thermal conditions during crystallization of ice on aluminum substrates. FIG. 3A shows temperature profiles of the various components of the ice growth system 10 during crystallization of ice on aluminum. FIG. 3B shows the temperature profile (designated with arrow in the IR image inset) along the substrate-ice-water line at 60 minutes into an ice growth. The temperature profiles in FIG. 3A for the substrate 16 and sample holder 14 reflect the imposed temperature ramp from $T_i$ to $T_f$, while the temperature in the room 50 and reservoir 20 remain constant during crystallization.

Temperature monitoring was conducted with both IR imaging and thermocouples to characterize the thermal stability and gradients present during ice growth. The temperatures of the ambient air in the chamber 50, water reservoir 20, substrate 16, and sample holder 14 during ice crystallization on aluminum were recorded for the entire 2.5 h growth period as seen in FIG. 3A. The data show that the reservoir 20 remained at 0.4±1° C. for the entire duration of ice growth. While the room 50 had a set point of −14° C., the temperature in the immediate vicinity of the reservoirs was −9.0±1.0° C. and the temperature ramp imposed on the sample holder 14 was consistently translated to the substrate 16. The substrate temperature closely resembles the thermal profile imposed on the sample holder 14, indicating a temperature difference of 2.4° C. at the ice-water growth front at the start of crystallization. These measurements indicated a thermal difference of 2.4° C. at the ice-water growth front. The thermal difference is determined from the difference in start temperatures of the reservoir and substrate (FIG. 3A, t=0:00:00).

Images were taken with an IR camera at various time points during crystallization on aluminum to further characterize the thermal difference between the substrate 16 and reservoir 20. A snapshot of the conditions at 60 min is shown in FIG. 3B. This image indicates that the substrate 16 is at approximately −8±1° C. and the reservoir top is at 1±1° C. at 60 min into the growth process. While the IR values for the reservoir are consistent with the thermocouple data (FIG. 3A), the lower apparent substrate temperature is likely a result of the sample holder reflectivity, which introduces uncertainty into the IR measurement.

On a microscale, the thermal conditions outlined above combined with a draw rate of 0.9 µm/s resulted in 1 cm thick ice laminates on the three different material substrates 16. The actual shape of each laminate was a close replicate of the underlying rectangular shape of each substrate 16 as a result of slow draw rate with a small initial undercooling of the substrate 16 at $T_i$, under conditions where the draw rate closely matched the velocity of the freezing front (e.g., to within 10%, more preferably to within 5%, most preferably to within 1%). While the experiments mostly utilized 30×40 mm interface area on the substrate, the same temperature profile can be used to form laminates on larger substrates of 40×60 mm. Additionally, continued growth for longer times at $T_f$, can be used to form thicker laminates. More specifically, for example, ice growth experiments on surfaces using the crystallization tower 10 have resulted in, for example, a 1 cm thick ice laminate grown on a 30×40 mm Teflon coated substrate in 2.5 h, a 1 cm thick ice laminate grown on a 40×60 mm Teflon coated substrate in 2.5 h, a 1 cm thick ice laminate grown on a 30×40 mm aluminum substrate in 2.5 h, a 4 cm thick ice laminate grown on a 30×40 mm aluminum substrate in 7 hours, and a 1.5 cm thick laminate drown on a 60×80 mm substrate in 3 hours.

All ice specimens exhibit a raised central area on the external surface of the ice. This feature is a result of both convective and conductive effects. Stirring the reservoir 20 impacts the convective flow in the reservoir 20; convective transfer of latent heat away from the center is more efficient in a stirred reservoir and has been associated with convex shaped growth of the crystal into the melt. In terms of conduction, heat transfer is most efficient in areas that have the greatest contact with the aluminum substrate (i.e., the substrate center), thus ice growth rate is increased due to the higher flux of latent heat away from the solid-liquid interface.

In this research, the goal is to grow ice laminates with columnar microstructures as the mechanical response of this ice is well characterized (see, e.g., D. Bentley et al., Fracture Toughness of Columnar Freshwater Ice from Large Scale DCB Tests, Cold Regions Science and Technology, 17 (1989) 7-20), which is a necessary requirement for ice adhesion studies. Columnar microstructures exist widely in nature as a result of growth in a temperature gradient, such as lake and sea ices and consists of elongated grains along the gradient with a tiled mosaic of grains with low aspect ratio and pseudo-hexagonal cross sections perpendicular to the gradient; in the plane of the water surface. To achieve columnar ice microstructures in the laminates grown in the crystallization tower 10, the substrate temperature was linearly ramped to lower temperatures during growth to facilitate the removal of latent heat of crystallization thereby maintaining a constant velocity of the crystallization front.

Thin sections of the ice laminates were imaged in cross-polarized light to study the microstructure. Ice grown on aluminum showed the characteristic mosaic of grains parallel to the plane of the substrate; elongated grains were seen in thin sections taken perpendicular to the substrate. The microstructure of ice laminates formed on Teflon under the same growth conditions showed more irregularly shaped grains in the plane of the substrate, but the grains were still elongated along the thickness of the laminate. The ice laminates grown on glass had the characteristic columnar microstructures, similar to laminates on aluminum, even though they were grown at larger undercooling.

The crystallization system 10 used here to adhere ice to different material surfaces by a vertical draw, crystallization-from-the-melt technique is highly versatile and able to access a wide range of ice microstructures depending on the thermal difference, draw rate, and time as well as pre-seeding of the interface. The ability to separately control the substrate and reservoir temperatures allowed the inventors to customize the undercooling and thermal gradient to grow ice at different temperatures and on material surfaces with different thermal, physical, and chemical properties.

The thermal conductivity of the materials, as well as the thickness of coatings, affects the conditions needed to grow ice laminates on the materials. For example, while aluminum, with the highest thermal conductivity (196 W/mK), could be grown with $T_i=-2°$ C. and $T_f=-6°$ C., glass, an insulator, required $T_i=-4°$ C. and $T_f=-8°$ C., as it is less effective at removing the latent heat. On the other hand, Teflon has a thermal conductivity (0.25 W/mK) which is lower than glass (0.96 W/mK), but ice laminates could be grown at smaller undercooling because it was only present as a thin (25 µm) coating. These findings are consistent with reports from droplet freezing on surfaces, wherein the temperature between the droplet and substrate is dominated by the heat conduction of the substrate. See, e.g., L Mishchenko et al., Design of Ice-Free Nanostructured Surfaces Based on Repulsion of Impacting Water Droplets, ACS Nano, 4 (2010) 7699-7707.

The surface roughness of the substrate material affects the microstructure of the ice grown on surfaces under identical thermal conditions. For example, while columnar ice laminates were grown on both aluminum and Teflon substrates with $T_i=-2°$ C. and $T_f=-6°$ C., the shape of the ice grains in the plane of the Teflon substrate were only negligibly pseudo-hexagonal. This observation is in alignment with other reports that have found the structure of ice grown on a surface is impacted by that surface. See, e.g., M. J. Shultz, Ice Surfaces, Annual Review of Physical Chemistry, 68 (2017) 285-304. In the case of Teflon versus aluminum, the Teflon surfaces are rough (1.29±0.27 µm) as compared to the polished aluminum (0.29±0.01 µm), as well as glass (Ra=0.46±0.03 nm), which is a likely contributor to the irregular microstructure.

The results presented herein also illustrate how the wettability of the substrate materials affects ice crystallization and microstructure. Consider hydrophobic Teflon, with high contact angle (114±2/96±2) as compared to aluminum and glass (71±2/44±3 and 28±2/17±2, respectively). All other things being constant, hydrophobic surfaces are known to inhibit droplet freezing. This reality may also be relevant to the freezing of bulk water on Teflon surfaces, causing the microstructure at the interface to experience delayed, irregular freezing, contributing to the irregular grain shape in the plane of the Teflon substrate.

A new crystallization tower, based on the vertical draw, crystallization-from-the-melt technique of Czochralski, was designed, constructed, and validated for the growth of columnar ice on a range of material surfaces. The crystallization tower is highly versatile, with adjustable substrate and reservoir temperatures, variable stir and draw rate, and can accommodate a range of substrate sizes. Due to the versatility of the substrate and reservoir temperatures as well as the draw rate, growth conditions can be tuned to the properties of materials of interest to ice adhesion studies.

While the focus of this disclosure is on the formation of polycrystalline columnar ice microstructures, with small thermal differences and slow withdraw rates, ice with large crystalline domains, which approach monocrystalline, can also be formed in this same system. Conversely, under large, cold temperature differences, ice laminates with random polycrystalline microstructure are formed on the substrate. With intermediate temperature differences and seeding, and minor adjustments to the undercooling, this crystallization tower can be used to grow ice with columnar microstructures, in a highly robust and automated fashion, which is of great utility to ice adhesion studies.

The size of the ice laminates is only limited by the reservoir diameter (lateral dimension) and the travel distance of the linear stage 24. With the current reservoir size of 600 mL, the largest substrate that can be used is up to 60 mm diameter and the tallest (thickest laminate) crystal that can be grown is 75 mm, provided the reservoir is periodically refilled. Larger reservoirs (e.g., 2000 mL and 5000 mL) have been implemented to further broaden the impact of this system for crystallization of ice on a wide range of surface types and sizes, and the growth of a large range of ice crystals for fundamental studies. The 2000 mL reservoir is compatible with the existing tower frame size; the largest reservoir (5000 mL) is used with a crystallization tower that has a body or frame that is about 64 cm tall with a 41×44.5 cm base.

Figure 4:
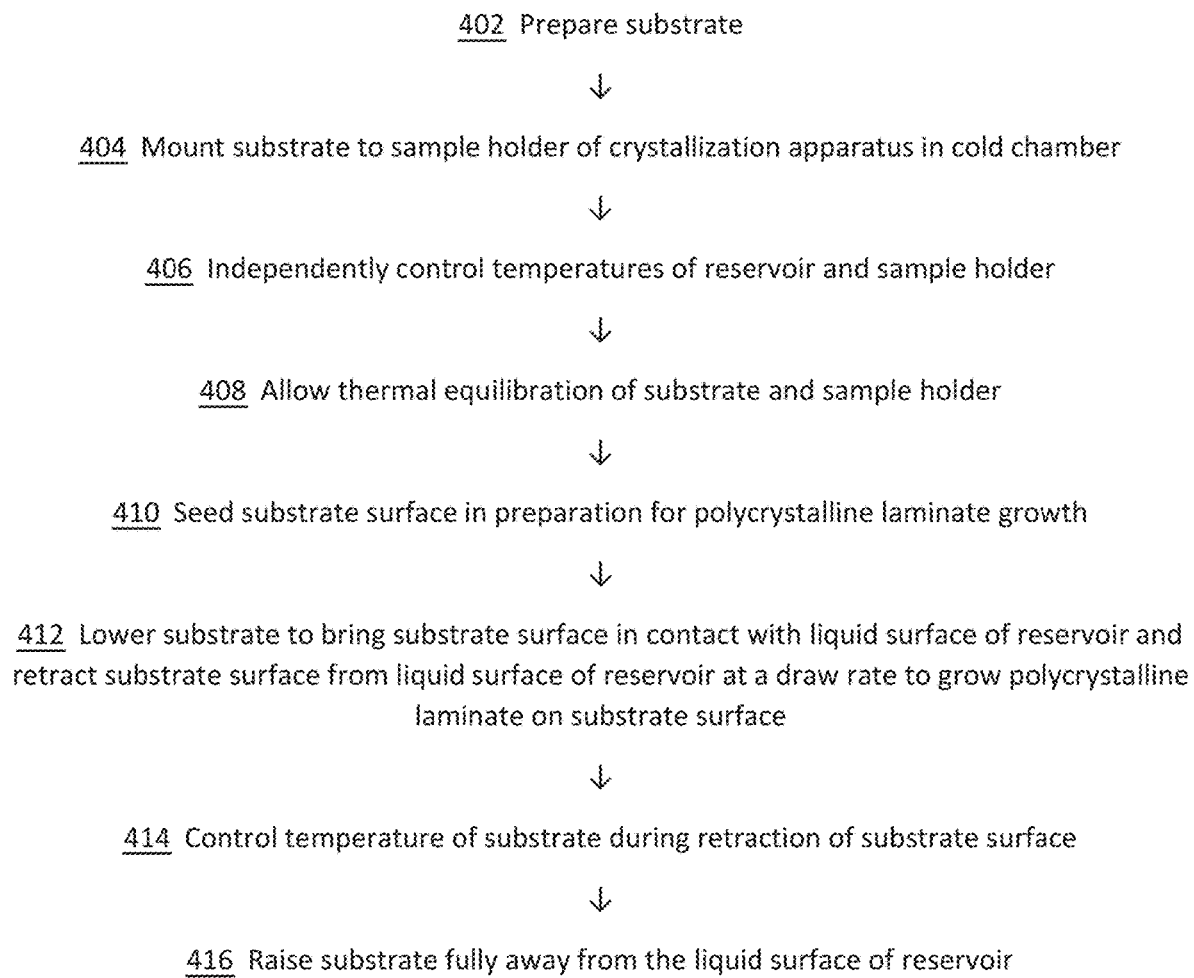
FIG. 4 is a flow diagram of the crystallization process for forming polycrystalline laminate such as polycrystalline ice laminate using the vertical draw apparatus according to an embodiment of the present invention.

FIG. 4 is a flow diagram of the crystallization process for forming polycrystalline laminate such as polycrystalline ice laminate using the vertical draw apparatus according to an embodiment of the present invention. In step 402, the substrate 16 is prepared (e.g., by cleaning the substrate surface with ultrapure water and allowing it to dry). In step 404, the substrate 16 is mounted to the back plate 18 of the sample holder 14 and the vertical draw apparatus 10 is placed in the cold chamber 50 set to a desired chamber temperature (e.g., about −14° C.).

In step 406, the temperature of the reservoir 20 is controlled (e.g., by immersion circulation and using the stir plate 36 at a rate of about 60 rpm and set to about 1.75° C.) and the temperature of the sample holder is controlled independently of the temperature control of the reservoir 20 (e.g., by circulating fluid through the sample holder 14). In step 408, to ensure thermal equilibration of the substrate 16 with the sample holder 14, the assembly is allowed to equilibrate for a period of time (e.g., about 30 minutes) before crystallization is initiated. A stable water surface temperature is achieved for ice growth (e.g., about 0.4±1° C.). During the thermal equilibration, the substrate 16 and back plate 18 are allowed to set in the sample holder 14 at an initial temperature (T), which depends on the material properties of the target substrate 16. For ice growth on aluminum and Teflon-coated aluminum, $T_i$ was set to about −2° C. For growth on glass, $T_i$ was set to about −4° C. In step 410, after thermal equilibration, the substrate 16 is sprayed with seed droplets and returned to the crystallization tower 10. To direct nucleation of polycrystalline ice on the material surfaces, the substrate 16 is seeded by spraying the pre-chilled surface of the substrate with ultrapure water. Regardless of the surface wettability of the substrate materials used, the seed droplet sizes are statistically similar on each substrate: e.g., about 14±6 μm on aluminum; about 27±11 μm on Teflon; and about 29±10 μm on glass. Consistent with delayed droplet freezing on hydrophobic and super-hydrophobic surfaces, seed droplets on Teflon required an additional 10 min to freeze before ice growth was induced on the surfaces.

In step 412, the automated linear stage 24 is used to lower the substrate 16 and bring the substrate surface in capillary contact with the liquid surface of the reservoir 20. The substrate holder retraction is engaged, for example, by withdrawing the coupon at a fixed rate of about 0.9 μm/s for the duration of the ice growth. During substrate holder retraction and ice growth, in step 414, the temperature of the substrate 16 is controlled with a temperature ramp from $T_i$ to a final temperature ($T_f$) while the reservoir 20 was held at a constant temperature (e.g., about 0.4±0.2° C. at the reservoir surface). For the growth of polycrystalline columnar ice, the substrate 16 is held at $T_i$ for 30 min, then linearly ramped to $T_f$ over the course of about 1.5 h, followed by a hold at $T_f$ for about 30 min in a specific embodiment. For aluminum and Teflon-coated aluminum, $T_i$=about −2° C. and $T_f$=about −6° C. For glass substrates, $T_i$=about −4° C. and $T_f$=about −8° C. as a result of the low thermal conductivity of glass and the use of thermal grease to adhere to the aluminum substrate. Upon completion of the ice growth process, in step 416, the stage 24 then raises the substrate 16 fully away from the liquid surface of the reservoir 20 by lifting the substrate holder 14.

In specific embodiments, as in the above examples involving different substrate materials, to achieve stable growth conditions (e.g., rectangular ice laminates that match the rectangular substrate shape), the net heat flow through the substrate must match the rate at which heat is generated by the crystallization process (see, e.g., D. T. J. Hurle, "Crystal Pulling from the Melt," Springer-Verlag, 1993). Essentially, the velocity of the freezing front (e.g., the ice crystallization growth rate) is determined by the ambient temperature in the chamber 50, liquid surface temperature of the reservoir 20, initial temperature $T_i$ and final temperature $T_f$ of the substrate 16, linear temperature ramping from $T_i$ to $T_f$, diameters of the substrate and reservoir, as well as the densities of the liquid and solid (water and ice in this case). The draw rate of the substrate 16 is selected to closely match the velocity of the freezing front. Under these conditions and using appropriate seeding of the substrate surface with seed droplets, it is possible to achieve consistent polycrystalline columnar microstructures. While the velocity of the freezing front for given reservoir size and draw rate and cylindrical seed crystal size can be calculated for a single crystal growth on a seed, such a mathematical expression does not fit the present scenario of polycrystalline growth on a rectangular substrate. As such, numerous tuning experiments are used to bring the draw rate and velocity of the freezing front into confluence. The information on these parameters can be collected in a database and stored (e.g., in a computer-readable storage medium), and be provided for use by any entity to grow ice on surfaces of different materials in a reproducible manner using the vertical draw system and method. The stored information may include information on substrate materials, the seed droplets, the ambient temperature, the temperature of the substrate (including the stir rate of a stir plate if it is used to control the temperature of the reservoir), the temperature of the reservoir, the temperature difference between the substrate and the reservoir over the period of time for crystallization growth, and draw rate. Because the stored information has previously been used to grow polycrystalline ice with columnar microstructures on the substrate surface for different substrate materials, standard methods for ice adhesion testing and analysis are possible.

Figure 5:
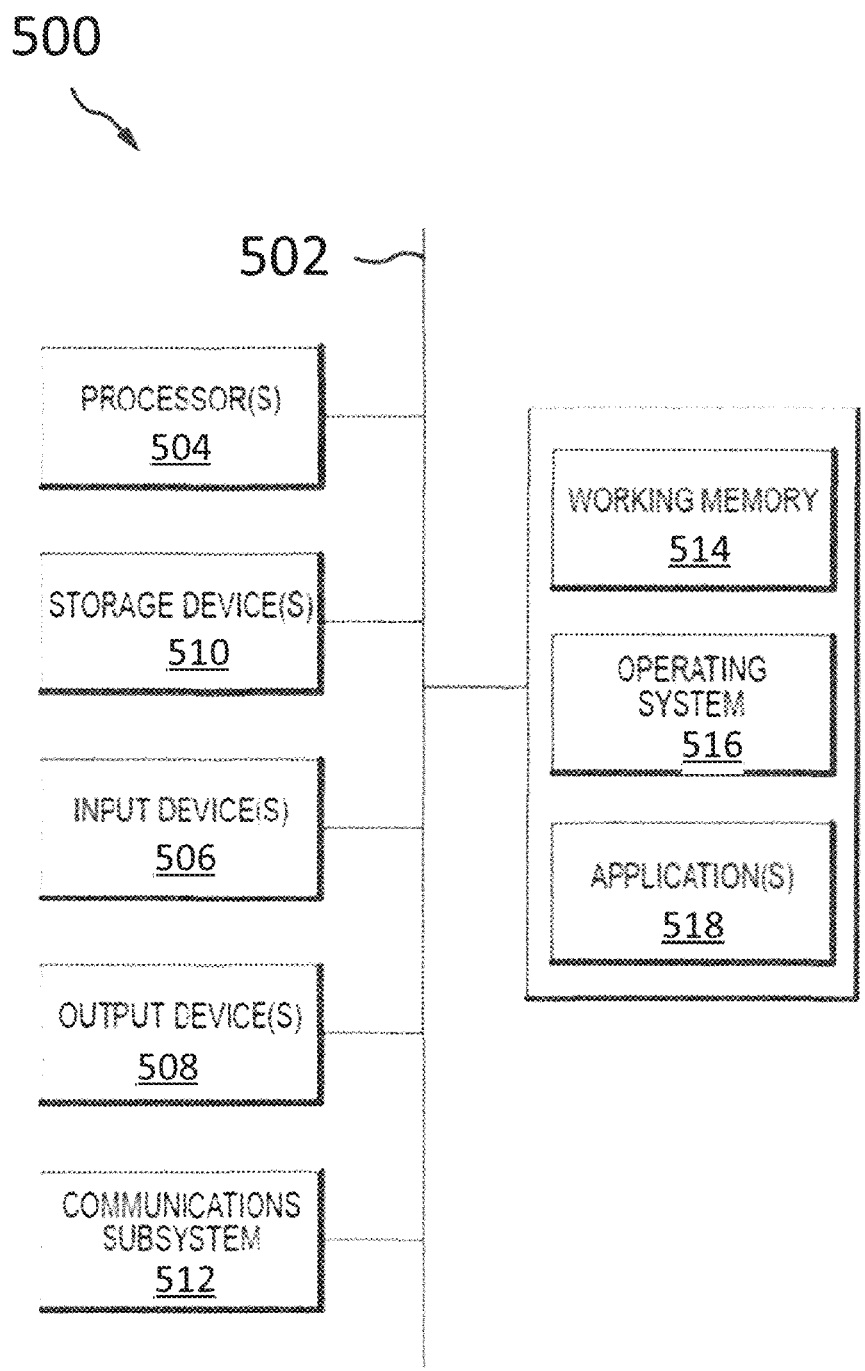
FIG. 5 depicts an exemplary computer system or device configured for use with the vertical draw apparatus according to an embodiment of the present invention.

FIG. 5 depicts an exemplary computer system or device 500 configured for use with the vertical draw apparatus 10 according to an embodiment of the present invention. An example of a computer system or device 500 may include an enterprise server, blade server, desktop computer, laptop computer, tablet computer, personal data assistant, smartphone, any combination thereof, and/or any other type of machine configured for performing calculations. Any computing devices encompassed by embodiments of the present invention may be wholly or at least partially configured to exhibit features similar to the computer system 500.

The computer device 500 of FIG. 5 is shown comprising hardware elements that may be electrically coupled via a bus 502 (or may otherwise be in communication, as appropriate). The hardware elements may include a processing unit with one or more processors 504, including without limitation one or more general-purpose processors and/or one or more special-purpose processors (such as digital signal processing chips, graphics acceleration processors, and/or the like); one or more input devices 506, which may include without limitation a remote control, a mouse, a keyboard, and/or the like; and one or more output devices 508, which may include without limitation a presentation device (e.g., controller screen), a printer, and/or the like. In some cases, an output device 508 may include, for example, a display subsystem, a printer, a fax machine, or non-visual displays such as audio output devices. The display subsystem may be a cathode ray tube (CRT), a flat-panel device such as a liquid crystal display (LCD), a projection device, or the like. The display subsystem may also provide a non-visual display such as via audio output devices. In general, use of the term "output device" is intended to include a variety of conventional and proprietary devices and ways to output information from computer system 500 to a user.

The computer system 500 may further include (and/or be in communication with) one or more non-transitory storage devices 510, which may comprise, without limitation, local and/or network accessible storage, and/or may include, without limitation, a disk drive, a drive array, an optical storage device, a solid-state storage device, such as a random access memory, and/or a read-only memory, which may be programmable, flash-updateable, and/or the like. Such storage devices may be configured to implement any appropriate data stores, including without limitation, various file systems, database structures, and/or the like.

The computer device 500 can also include a communications subsystem 512, which may include without limitation a modem, a network card (wireless and/or wired), an infrared communication device, a wireless communication device and/or a chipset such as a Bluetooth device, 802.11 device, WiFi device, WiMax device, cellular communication facilities such as GSM (Global System for Mobile Communications), W-CDMA (Wideband Code Division Multiple Access), LTE (Long Term Evolution), and the like. The communications subsystem 512 may permit data to be exchanged with a network (such as the network described below, to name one example), other computer systems, controllers, and/or any other devices described herein. In many embodiments, the computer system 500 can further comprise a working memory 514, which may include a random access memory and/or a read-only memory device, as described above.

The computer device 500 also can comprise software elements, shown as being currently located within the working memory 514, including an operating system 516, device drivers, executable libraries, and/or other code, such as one or more application programs 518, which may comprise computer programs provided by various embodiments, and/or may be designed to implement methods, and/or configure systems, provided by other embodiments, as described herein. By way of example, one or more procedures described with respect to the method(s) discussed above, and/or system components might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code can be stored on a non-transitory computer-readable storage medium, such as the storage device(s) 510 described above. In some cases, the storage medium might be incorporated within a computer system, such as computer system 500. In other embodiments, the storage medium might be separate from a computer system (e.g., a removable medium, such as flash memory), and/or provided in an installation package, such that the storage medium may be used to program, configure, and/or adapt a general purpose computer with the instructions/code stored thereon. These instructions might take the form of executable code, which is executable by the computer device 500 and/or might take the form of source and/or installable code, which, upon compilation and/or installation on the computer system 500 (e.g., using any of a variety of generally available compilers, installation programs, compression/decompression utilities, and the like), then takes the form of executable code.

It is apparent that substantial variations may be made in accordance with specific requirements. For example, customized hardware might also be used, and/or particular elements might be implemented in hardware, software (including portable software, such as applets, and the like), or both. Further, connection to other computing devices such as network input/output devices may be employed.

As mentioned above, in one aspect, some embodiments may employ a computer system (such as the computer device 500) to perform methods in accordance with various embodiments of the disclosure. According to a set of embodiments, some or all of the procedures of such methods are performed by the computer system 500 in response to processor 504 executing one or more sequences of one or more instructions (which might be incorporated into the operating system 516 and/or other code, such as an application program 518) contained in the working memory 514. Such instructions may be read into the working memory 514 from another computer-readable medium, such as one or more of the storage device(s) 510. Merely by way of example, execution of the sequences of instructions contained in the working memory 514 may cause the processor(s) 504 to perform one or more procedures of the methods described herein.

The terms "machine-readable medium" and "computer-readable medium," as used herein, can refer to any non-transitory medium that participates in providing data that causes a machine to operate in a specific fashion. In an embodiment implemented using the computer device 500, various computer-readable media might be involved in providing instructions/code to processor(s) 504 for execution and/or might be used to store and/or carry such instructions/code. In many implementations, a computer-readable medium is a physical and/or tangible storage medium. Such a medium may take the form of a non-volatile media or volatile media. Non-volatile media may include, for example, optical and/or magnetic disks, such as the storage device(s) 510. Volatile media may include, without limitation, dynamic memory, such as the working memory 514.

Exemplary forms of physical and/or tangible computer-readable media may include a floppy disk, a flexible disk, hard disk, magnetic tape, or any other magnetic medium, a compact disc, any other optical medium, ROM, RAM, and the like, any other memory chip or cartridge, or any other medium from which a computer may read instructions and/or code. Various forms of computer-readable media may be involved in carrying one or more sequences of one or more instructions to the processor(s) 504 for execution. By way of example, the instructions may initially be carried on a magnetic disk and/or optical disc of a remote computer. A remote computer might load the instructions into its dynamic memory and send the instructions as signals over a transmission medium to be received and/or executed by the computer system 500.

The communications subsystem 512 (and/or components thereof) generally can receive signals, and the bus 502 then can carry the signals (and/or the data, instructions, and the like, carried by the signals) to the working memory 514, from which the processor(s) 504 retrieves and executes the instructions. The instructions received by the working memory 514 may optionally be stored on a non-transitory storage device 510 either before or after execution by the processor(s) 504.

It should further be understood that the components of computer device 500 can be distributed across a network. For example, some processing may be performed in one location using a first processor while other processing may be performed by another processor remote from the first processor. Other components of computer system 500 may be similarly distributed. As such, computer device 500 may be interpreted as a distributed computing system that performs processing in multiple locations. In some instances, computer system 500 may be interpreted as a single computing device, such as a distinct laptop, desktop computer, or the like, depending on the context.

A processor may be a hardware processor such as a central processing unit (CPU), a graphic processing unit (GPU), or a general-purpose processing unit. A processor can be any suitable integrated circuits, such as computing platforms or microprocessors, logic devices and the like. Although the disclosure is described with reference to a processor, other types of integrated circuits and logic devices are also applicable. The processors or machines may not be limited by the data operation capabilities. The processors or machines may perform 512 bit, 256 bit, 128 bit, 64 bit, 32 bit, or 16 bit data operations.

Each of the calculations or operations discussed herein may be performed using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described herein. All features of the described systems are applicable to the described methods mutatis mutandis, and vice versa. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like. While the exemplary embodiments have been described in some detail, by way of example and for clarity of understanding, those of skill in the art will recognize that a variety of modification, adaptations, and changes may be employed.

As will be appreciated by one of ordinary skill in the art, the present invention may be embodied as an apparatus (including, for example, a system, a machine, a device, and/or the like), as a method (including, for example, a business process, and/or the like), as a computer-readable storage medium, or as any combination of the foregoing.

Embodiments of the invention can be manifest in the form of methods and apparatuses for practicing those methods.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. Mien used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method of crystallization growth on a substrate surface of a substrate having a substrate material, the method comprising: mounting the substrate to a sample holder with the substrate surface facing a liquid surface of a reservoir disposed in a chamber that provides an ambient temperature; seeding the substrate surface with seed droplets; lowering the substrate surface to the liquid surface of the reservoir; independently controlling a temperature of the substrate and a temperature of the reservoir to produce a temperature difference between the substrate and the reservoir over a period of time for crystallization growth; retracting the substrate surface from the liquid surface of the reservoir at a draw rate; wherein the draw rate and the temperature difference are selected to grow polycrystalline laminate on the substrate surface, wherein the polycrystalline laminate is polycrystalline ice laminate and wherein the draw rate is a fixed rate selected to closely match a velocity of a freezing front of ice growth on the substrate surface wherein the temperature of the reservoir is controlled to achieve a stable liquid surface temperature.

2. The method of claim 1, wherein the temperature of the substrate is controlled by undercooling the sample holder to an initial temperature that is lower than the liquid surface temperature for an initial period of time, ramping the temperature of the substrate from the initial temperature to a final temperature that is lower than the initial temperature for a ramp period of time, and holding the temperature of the substrate at the final temperature for a final period of time.

3. The method of claim 2, wherein the temperature of the substrate is linearly ramped from the initial temperature to the final temperature.

4. The method of claim 1, further comprising: prior to seeding the substrate surface, allowing thermal equilibration of the substrate and the sample holder for an equilibration period of time.

5. The method of claim 1, further comprising: maintaining the ambient temperature in the chamber at a level that is lower than the temperature of the substrate.

6. The method of claim 1, wherein seeding the substrate surface comprises spraying the substrate surface with ultrapure water.

7. The method of claim 1, wherein the method is performed according to stored information that includes at least one of the substrate material, the seed droplets; the ambient temperature, the temperature of the substrate; the temperature of the reservoir, the temperature difference between the substrate and the reservoir over the period of time for crystallization growth, or the draw rate, the stored information having previously been used to grow polycrystalline ice with columnar microstructures on the substrate surface.

8. A system of crystallization growth on a substrate surface of a substrate having a substrate material, the system comprising: a frame disposed in a chamber that provides an ambient temperature; a container having a reservoir therein; a sample holder to mount the substrate above the reservoir with the substrate surface facing a liquid surface of the reservoir; a sample holder temperature control device to control a temperature of the sample holder; a reservoir temperature control device to control a temperature of the reservoir independently of the temperature of the sample holder to produce a temperature difference between the substrate and the reservoir over a period of time for crystallization growth; and a linear stage to lower the substrate surface to the liquid surface of the reservoir and to retract the substrate surface from the liquid surface of the reservoir at a draw rate; wherein the draw rate and the temperature difference are selected to grow polycrystalline laminate on the substrate surface.

9. The system of claim 8, further comprising a computer programmed to: after the substrate surface is seeded with seed droplets, lower the substrate surface to the liquid surface of the reservoir; independently control the temperature of the substrate and the temperature of the reservoir to produce a temperature difference between the substrate and the reservoir; and retract the substrate surface from the liquid surface of the reservoir at a draw rate selected to grow polycrystalline ice laminate on the substrate surface.

10. The system of claim 9, wherein the temperature of the reservoir is controlled to achieve a stable liquid surface temperature.

11. The system of claim 10, wherein the temperature of the substrate is controlled by undercooling the sample holder to an initial temperature that is lower than the liquid surface temperature for an initial period of time, ramping the temperature of the substrate from the initial temperature to a final temperature that is lower than the initial temperature for a ramp period of time, and holding the temperature of the substrate at the final temperature for a final period of time.

12. The system of claim 11, wherein the tempera the substrate is linearly ramped from the initial temperature to the final temperature.

13. The system of claim 12, wherein the draw rate is a fixed rate selected to closely match a velocity of a freezing front of ice growth on the substrate surface.

14. The system of claim 9, wherein the computer is programmed to: prior to seeding the substrate surface, allow thermal equilibration of the substrate and the sample holder for an equilibration period of time.

15. The system of claim 9, wherein the computer is programmed to: maintain the ambient temperature in the chamber at a level that is lower than the temperature of the substrate.

16. The system of claim 9, wherein the computer is programmed to employ stored information that includes at least one of the substrate material, the seed droplets, the ambient temperature; the temperature of the substrate, the temperature of the reservoir; the temperature difference between the substrate and the reservoir over the period of time for crystallization growth, or the draw rate, the stored information having previously been used to grow polycrystalline ice with columnar microstructures on the substrate surface.

17. A computer program product for crystallization growth on a substrate surface of a substrate having a substrate material, which is mounted to a sample holder with the substrate surface facing a liquid surface of a reservoir disposed in a chamber that provides ambient temperature, the computer program product embodied on a non-transitory tangible computer readable medium, comprising: computer-executable code for, after the substrate surface is seeded with seed droplets, lowering the substrate surface to the liquid surface of the reservoir; computer-executable code for independently controlling the temperature of the substrate and the temperature of the reservoir to produce a temperature difference between the substrate and the reservoir over a period of time for crystallization growth; and computer-executable code for retracting the substrate surface from the liquid surface of the reservoir at a draw rate; wherein the draw rate and the temperature difference are selected to grow polycrystalline laminate on the substrate surface.

18. The computer program product of claim 17, further comprising: computer-executable code for employing stored information that includes at least one of the substrate material, the seed droplets, the ambient temperature, the temperature of the substrate, the temperature of the reservoir, the temperature difference between the substrate and the reservoir over the period of time for crystallization growth, or the draw rate, the stored information having previously been used to grow polycrystalline ice laminate with columnar microstructures on the substrate surface.

* * * * *